United States Patent [19]

Tabara

[11] Patent Number: 5,451,293
[45] Date of Patent: Sep. 19, 1995

[54] METHOD OF MAKING A WIRING LAYER WHEREIN THE MASKING MATERIAL IS ASHED USING AN ALCOHOL CONTAINING PLASMA

[75] Inventor: Suguru Tabara, Hamamatsu, Japan

[73] Assignee: Yamaha Corporation, Hamamatsu, Japan

[21] Appl. No.: 33,178

[22] Filed: Mar. 16, 1993

[30] Foreign Application Priority Data

Mar. 18, 1992 [JP] Japan .................................. 4-091990

[51] Int. Cl.⁶ ..................... B44C 1/22; C03C 15/00; H01L 21/00; H01L 21/31
[52] U.S. Cl. ..................... 216/13; 437/229; 216/41
[58] Field of Search ...................... 156/659.1; 437/229

[56] References Cited

U.S. PATENT DOCUMENTS

| | | | |
|---|---|---|---|
| 4,961,820 | 10/1990 | Shinegawa et al. | 156/643 |
| 5,057,187 | 10/1991 | Shinegawa et al. | 156/643 |
| 5,227,341 | 7/1993 | Kamide et al. | 437/229 |

FOREIGN PATENT DOCUMENTS

| | | |
|---|---|---|
| 0087276 | 5/1983 | Japan . |
| 2-77125 | of 1990 | Japan . |
| 0083337 | 4/1991 | Japan . |

OTHER PUBLICATIONS

Wolf & Tauber, *Silicon Processing for the VLSI Era, vol. I; Process Technology*, 559–564 (1986).
*Semiconductor World* 101–106 (Apr. 1989).
*Semiconductor World* 120–125 (Oct. 1989).
*Semiconductor World* 130–136 (Oct. 1989).
*Semiconductor World* 62–66 (Nov. 1991).
Cameron & Chambers, "Successfully Addressing Post--Etch Corrosion," *Semiconductor International* 142–147 (May 1989).
Hannon & Cook, "Oxidative Removal of Photoresist by Oxygen/Freon 116 Discharge Products," 131 *J. Electrochem. Soc: Solid State Science & Tech*, 1164–1169 (May 1984).
Lee, Eldridge & Schwartz, "Reactive Ion Etching Induced Corrosion of Al and Al-Cu Films," 52 *J. Applied Phys.* 2994–2999 (Apr. 1981).
Tetsuo Kondo, et al., "Effects of H₂O Downstream on After Corrosion," *Proceedings of Symposium on Dry Process, Institute of Electrical Engineers of Japan* 117–122 (Oct. 1991).

Primary Examiner—R. Bruce Breneman
Assistant Examiner—Bryon S. Everhart
Attorney, Agent, or Firm—Spensley Horn Jubas & Lubitz

[57] ABSTRACT

An Al based wiring material layer is formed on an insulating film covering the surface of a semiconductor substrate. The wiring material layer is then selectively etched by a Cl base gas by using a resist layer as a mask, to form a wiring layer. The resist layer is ashed by using a plasma of a mixed gas of an H-and-O containing gas and a F containing gas, such as $O_2/CHF_3/CH_3OH$, without heating the substrate. Cl components are removed in the form of HCl, and excessive H components are removed in the form of HF to suppress the generation and adherence of $H_2O$, thereby improving the anticorrosion performance. The substrate is not heated so that the resist is prevented from a quality change and curing, allowing the resist to be easily removed. Another ashing process may be performed thereafter by using a F containing $O_2$ gas such as $O_2/CHF_3$.

36 Claims, 4 Drawing Sheets

METHOD OF MAKING A WIRING LAYER WHEREIN THE MASKING MATERIAL IS ASHED USING AN ALCOHOL CONTAINING PLASMA

BACKGROUND OF THE INVENTION a) Field of the Invention

The present invention relates to a method of making wiring layer used for the manufacture of integrated circuits such as LSIs, and more particularly to a method of making a wiring layer capable of improving an anticorrosion function and easily removing a resist film during a resist ashing process after patterning a wiring layer.

b) Description of the Related Art

A conventional method of making wiring layer for LSIs or the like such as shown in FIG. 7 is known. An aluminum (Al) based wiring material layer, i.e. Al or Al alloy is deposited on an insulting film 12 such as silicon oxide covering the surface of a semiconductor substrate 10 such as silicon. Thereafter, a resist layer 16 is formed thereon and patterned in a desired layout. Using the resist layer 16 as a mask, the Al based wiring material layer is selectively etched by using a Cl based gas such as $BCl_3$ and $Cl_2$ to form a wiring layer 14.

Thereafter, an ashing process is performed to remove the resist layer 16 and by-products generated during the etching process. The ashing process is defined as a process which resolves a resist and by-products during etching process to thereby remove them from a semiconductor substrate. The ashing process is performed under plasma assisted circumstances, and the reaction mechanism of the plasma-assisted ashing process including oxygen is considered as follows:

$$C_xH_y + \{2x + (y/2)\}O(\text{radical}) \Delta x CO_2 \uparrow + (y/2)H_2O$$

i.e., oxygen radical generated in the plasma reacts with organic materials included in the resist materials, the resist materials are oxidized and resolved. The ashing process has been performed heretofore by two methods. The first method performs the ashing by using a plasma of a mixed gas of a fluorine (F) containing gas such as $CF_4$ and an $O_2$ gas. The second method performs the ashing by using a plasma of a mixed gas, which contains hydrogen and oxygen (a H-and-O containing gas) such as $CH_3OH$ (methyl alcohol) and an $O_2$ gas. Reference may be made to Japanese Patent Laid-open Publications Nos. 58-87276 and 3-83337 respectively for the first and second methods.

The first method cannot remove Cl components sufficiently, which have attached during the etching process on the surface of the wafer. The unremoved Cl components may corrode a wiring. For a laminated layer having a barrier metal layer such as TiW and TiN under the Al based wiring material layer, there are not only the unremoved Cl components but also local batteries formed by the layers. Thus, corrosion can more likely occur.

The second method is an improved version of the first method. With the second method, however, it is necessary to heat a substrate or wafer to about 200° to 350° C. order to obtain a practical ashing speed. This heating process alters the quality of, and cures, the resist surface layer in which the etching gas and by-products (such as $AlCl_x$, $CuCl_2$, $SiCl_x$) have been mixed. As shown in FIG. 7, resist surface layers of the resist film 16, particularly resist surface layers 16a and 16b, may be left unremoved which are in some cases called rabbit ears.

Although such resist surface layers 16a and 16b may also be left unremoved when using the first method, these layers can be readily washed out by amine based solvent. However, with the second method, the quality change and curing of the resist surface layer reached sometimes to the extent that the surface layer cannot be removed even if it is processed by amine based solvent, lowering the manufacturing yield.

It has been tried to lower the heating temperature avoid the quality change and curing of a resist film. However, with a lowered temperature, not only the ashing speed lowers but also the anticorrosion function deteriorates.

SUMMARY OF THE INVENTION

It is an object of the present invention to provide a method of making wiring layer capable of improving an anticorrosion performance and easily removing a resist film during a resist ashing process after patterning a wiring layer.

According to an aspect of the present invention, there is provided a method of making wiring layer comprising the steps of: (a) forming a wiring material layer on an insulating film on a substrate; (b) patterning the wiring material layer by a selective etching process using a resist film as a mask, to form a wiring layer; and (c) ashing the resist film by using a plasma of a mixed gas of a H-and-O containing gas, a F containing gas, and an $O_2$ gas, without heating the substrate.

In the method of making wiring layer, an additional ashing process using a plasma of a mixed gas of a F containing gas and an $O_2$ gas may be performed after the ashing step (c).

With the method of making wiring layer, H components are contained in the ashing gas so that Cl components attached on the upper surface of the wafer during the etching process are removed in the form of HCl. The reason why the anticorrosion function deteriorates at the lower temperature of the substrate during the ashing process using a H containing gas and an $O_2$ gas, may be considered as $H_2O$ generated by plasma discharge attaches to and left on the upper surface of the wafer.

With the method of making wiring layer, F components are contained in the ashing gas so that the ashing speed increases, excessive H components are removed in the form of HF, and generation/attachment of $H_2O$ is suppressed. The anticorrosion function is therefore improved considerably. In addition, because the substrate is not heated, the quality change and curing of a resist film can be avoided, providing an easy removal of the resist film.

If the additional ashing process is performed, resist, Cl components, $H_2O$, and the like left on the upper surface of the wafer can be removed, particularly $H_2O$ can be removed efficiently, further improving the anticorrosion function.

A resist film is removed by plasma-assisted ashing process with an ashing gas of a mixed gas of a H-and-O containing gas and an $O_2$ gas added with a F containing gas. Accordingly, the anticorrosion function is improved and the removal of resist is easy, allowing to manufacture integrated circuits of high reliability with a high yield.

DETAILED DESCRIPTION OF THE PREFERRED EMBODIMENTS

Figure 1:
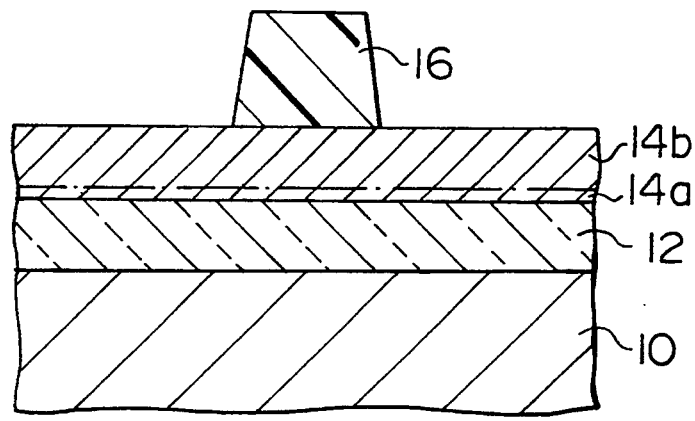
FIGS. 1 to 3 are cross sectional views of a semiconductor device explaining the method of making wiring layer according to an embodiment of the present invention.
Figure 2:
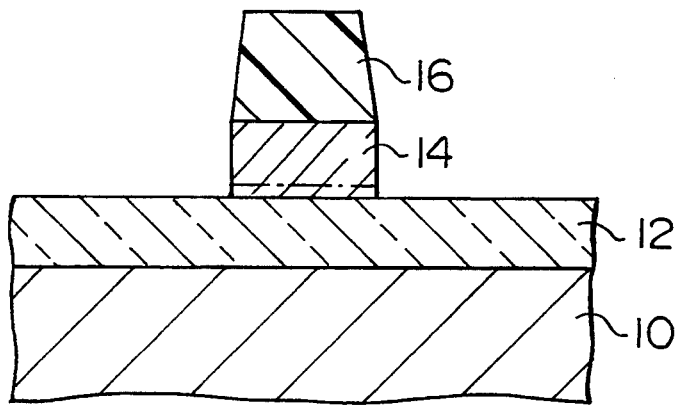
Figure 3:
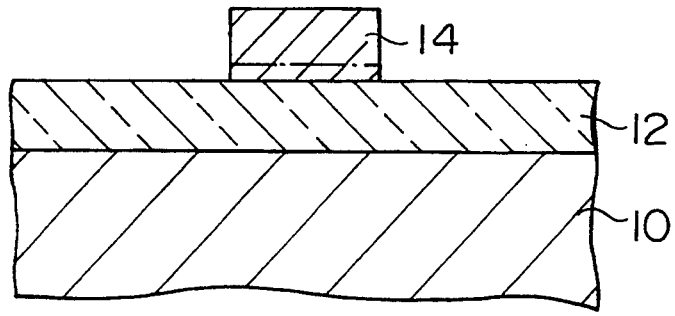

FIGS. 1 to 3 are cross sectional views of a semiconductor device explaining the method of making wiring layer according to an embodiment of the present invention. The processes (1) to (3) illustrated with FIGS. 1 to 3 respectively will be described in this order.

(1) An Al based wiring material layer 14A is formed by a sputtering method or the like on an insulating film 12 such as silicon oxide covering the surface of a semiconductor substrate 10 such as silicon. The Al based material is Al or one of Al alloys such as Al—Si, Al—Cu—Si. The wiring material layer 14A may be an Al—Si—Cu alloy layer 14b on a TiN layer (barrier metal layer). Resist is coated on the upper surface of the wafer by spin coating. The coated resist is patterned by a photolithography process to form a resisting layer 16 corresponding to a desired wiring pattern on the wiring material layer 14A. The resist may be positive type resist (novolak based resin), for example, OFPR-800 resist and TSMR series resist such as TSMR-8900 manufactured by Tokyo Ohka Kogyo Co. Ltd., Kawasaki, Kanagawa, Japan.

(2) Next, using the resist layer 16 as a mask, the wiring material layer 14A is patterned by a dry etching process to form a wiring layer 14. The etching gas may be a halogen gas, for example, Cl based gas such as $BCl_3$ and $Cl_2$.

(3) Next, an ashing process is performed to remove the resist layer 16 and by-products generated during the etching process. In this embodiment, the ashing process is performed in two steps under ashing condition D described later, by using a microwave plasma asher such as shown in FIG. 4.

Figure 4:
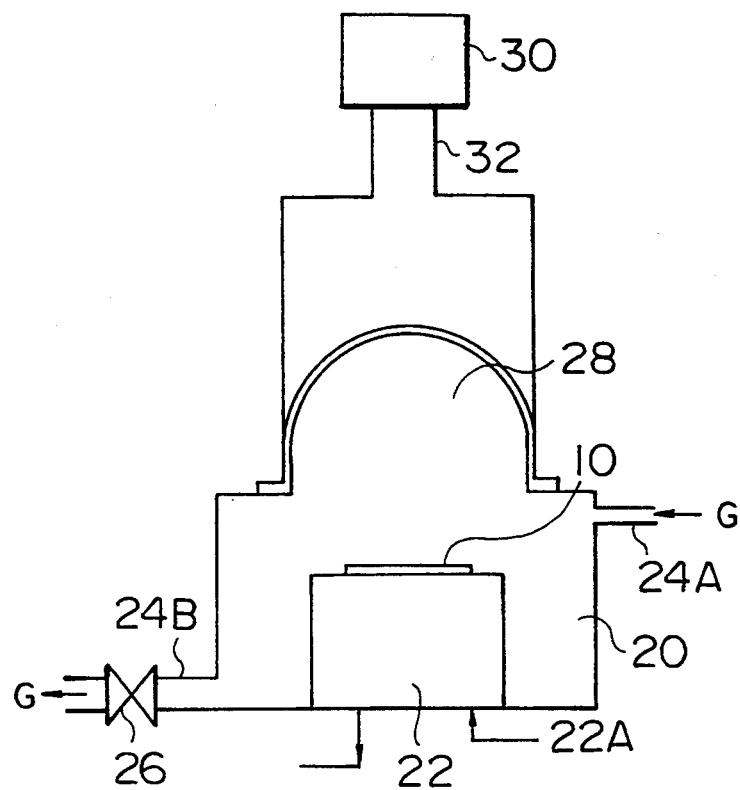
FIG. 4 is a diagram showing a microwave plasma asher used in the embodiment of the invention.

Referring to FIG. 4, a wafer of semiconductor substrate 10 was placed on a sample stage 22 in a processing chamber 20. The sample stage 22 was cooled to about 20° C. by circulating cooling water 22A. In the first ashing process, a mixed gas $O_2/CHF_3/CH_3OH$ as a processing gas G was supplied within the processing chamber 20 via a gas supply pipe 24A. The gas G was exhausted via a gas exhaust pipe 24B having a pressure control valve 26. The pressure was set to 1.2 Torr by the pressure control valve 26. The flow rate of $O_2/CHF_3/CH_3OH$ was set to 200:5:4 (sccm). This flow rate ratio may be set within the range of 200:5 to 20:20 to 100 (sccm).

At the second ashing process, a mixed gas $O_2/CHF_3$, as a processing gas G was supplied within the processing chamber 20, the gas flow rate was set to 100:5 (sccm), and the pressure was set to 0.3 Torr. The sample stage 10 was also cooled to about 20° C. By representing the gas and pressure conditions at the second ashing process by an ashing condition A and at the first ashing process by an ashing condition A1, the ashing condition D of this embodiment is represented by ashing condition A1+ ashing condition A.

Figure 5A:
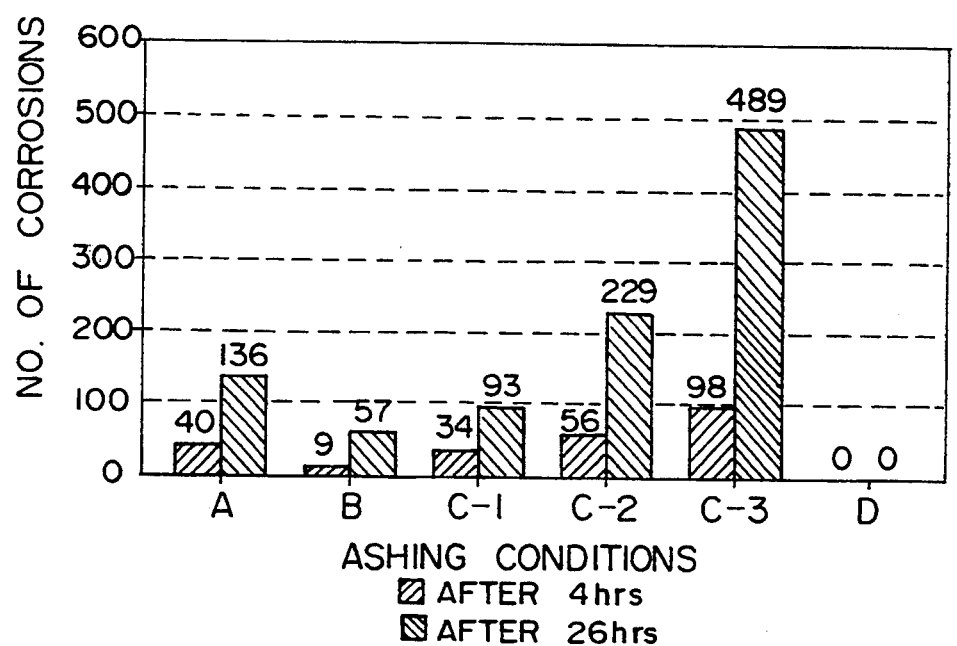
FIGS. 5A and 5B are graphs showing the dependency of the number of corrosions on the ashing conditions, the data shown in the graphs being obtained by using the embodiment method and conventional methods.
Figure 6:
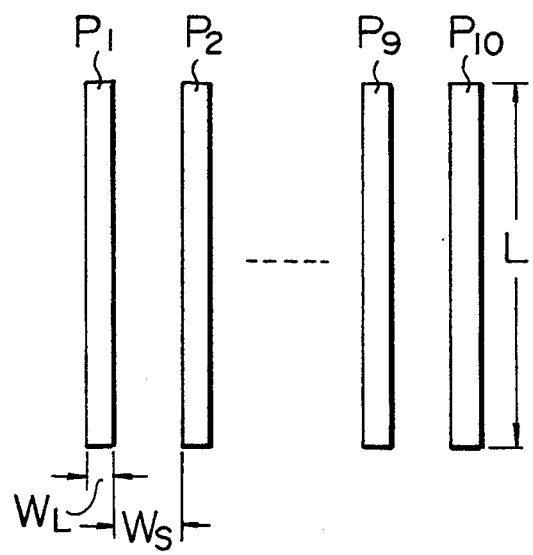
FIG. 6 is a plan view showing an example of a pattern used for observing corrosions.
Figure 7:
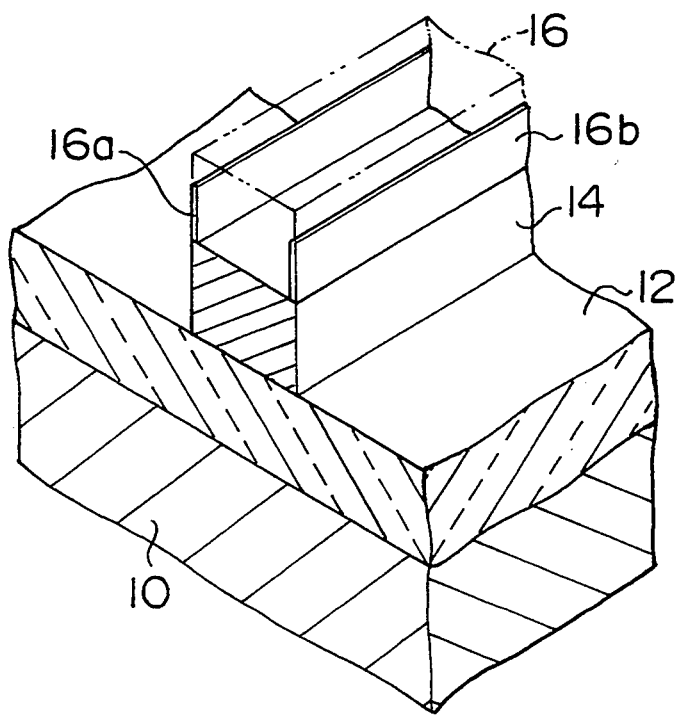
FIG. 7 is a perspective view of a substrate in section illustrating a conventional ashing process.

FIG. 5A shows the dependency of the number of corrosions on the ashing conditions. The "corrosions" are $AlOH_3$, salts or the like generated upon the reaction of Al with HCl which is generated by the coupling of Cl and $H_2O$ generated following the mechanism to be described later. These corrosions are formed on the aluminum wiring in the form of projections, e.g., spherical projection. The "number of corrosions" is the number of such projections counted through an electron microscope. The numbers of corrosions in FIG. 5A were measured using the corrosion observation pattern shown in FIG. 6. In FIG. 6, $P_1$ to $P_{10}$ represents an Al-Si-Cu/TiN laminated wiring layer formed on the underlying insulating film in the similar manner to forming the layer 14 shown in FIG. 3. The length L and width $W_L$ of each wiring layer were 61 μm and 1 μm, and the space between adjacent wiring layers was 3 μm. In FIG. 5A, the legends "after 4 hrs" and "after 26 hrs" mean "after 4 hours after the ashing" and "after 26 hours after the ashing", respectively.

In FIG. 5A, the ashing condition A corresponds to the second ashing process of the above embodiment, the ashing condition A corresponding to the conventional first method. The number of corrosions under the ashing condition A were 40 and 136 respectively after 4 hours and 26 hours after the ashing process. The number of corrosions under the ashing condition D according to the above-described embodiment was 0 after 4 hours and 26 hours after the ashing, and this zero state continued four days after the ashing.

For the comparison sake, the numbers of corrosions under conditions B, C-1 to C-3 are also shown. The details of these ashing conditions are as follows.

Ashing condition B: The first ashing process is performed by supplying a mixed gas $O_2/CH_3OH$ as the processing gas G at a flow rate of 200/40 (sccm) and by setting the pressure to 1.2 Torr, and thereafter the second ashing process is performed under the same condition as the ashing condition A. The ashing condition B corresponds to the conventional second and first ashing methods performed in this order.

Ashing condition C-1: The first ashing process is performed under the same condition as the ashing condition A, and the second ashing process is performed for 30 seconds by supplying a mixed gas $O_2/CH_3OH$ as the processing gas G at a flow rate of 50/10 (sccm) and by setting the pressure to 0.2 Torr. The ashing condition C-1 corresponds to the conventional first and second ashing methods performed in this order.

Ashing condition C-2: The second ashing process is performed for 50 seconds, with the other conditions being the same as the ashing condition C-1.

Ashing condition C-3: The flow rate of $O_2/CH_3OH$ is changed to 50/15 (sccm) and the second ashing process is performed for 50 seconds, with the other conditions being the same as the ashing condition C-1. In other words, the ashing condition C-3 differs from the ashing condition C-2 only in that the flow rate of $O_2/CH_3OH$ is changed to 50/15 (sccm).

From the comparison between the numbers of corrosions under the ashing conditions A and B shown in FIG. 5A, it can be said that the ashing condition B has a better anticorrosion performance. However, this improvement: not sufficient for practical use. The ashing conditions C-2 and C-3 have a larger number of corrosions than the ashing condition A. This increase of corrosions results from H₂O attached on the upper surface of the wafer, H₂O being by-products of a plasma process of a mixed gas O₂/CH₃.

It is conceivable that H₂O is generated by the following reaction formulae (1) and (2):

$$2H + O \rightarrow H_2O \quad (1)$$

$$H + OH \rightarrow H_2O \quad (2)$$

It is also conceivable that H-and-OH are generated by the following reaction formulae (3) and (4):

$$CH_3OH + e \rightarrow CH_3 + OH + e \quad (3)$$

$$CH_3 + e \rightarrow CH_{3-x} + xH + e \quad (4)$$

Why the anticorrosion performance is improved under the ashing condition D may be attributable to the following reasons (a) to (c):

(a) H radicals remove Cl components by the following reaction formula (5), reducing the amount of Cl attached on the tipper surface of the wafer:

$$H + Cl \rightarrow HCl \uparrow \quad (5)$$

(b) Adding CHF₃ increases the ashing speed and the reaction heat raises the temperature of the upper surface of the wafer, reducing the amount of H₂O attached on the upper surface of the wafer.

(c) F radicals remove excessive H radicals by the following reaction formula (6), so that the reactions given by the formulae (1) and (2) are suppressed, reducing the amount of H₂O to be generated:

$$H + F \rightarrow HF \quad (6)$$

Figure 5B:
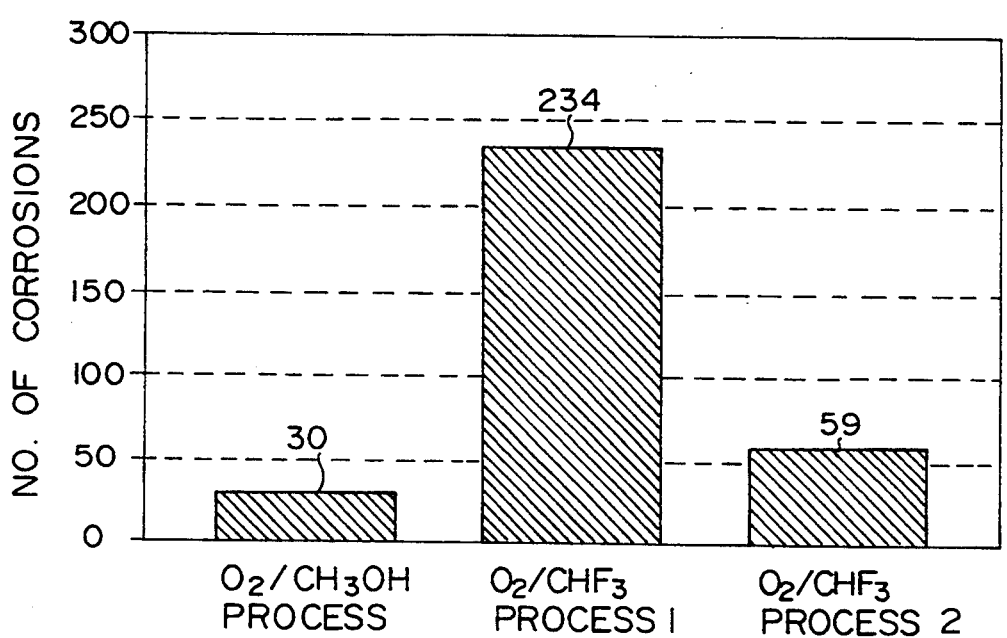

FIG. 5B shows the comparison between the conventional first and second ashing methods. The conditions (a) to (c) used for this comparison are as follows:

(a) O₂/CH₃OH process corresponding to the second method + CHF₃ plasma process including:
1st process
O₂/CH₃OH at 200/40 (sccm), 1.2 Torr, 30 sec.
2nd process
CHF₃ at 100 (sccm), 0.8 Torr, 20 sec.
resist ashing amount of about 80 nm, (b) O₂/CHF₃ process 1 corresponding to the first method + CHF₃ plasma process: including:
1st process
O₂/CHF₃ at 400/20 (sccm), 1.4 Torr, 5 sec.
2nd process
the same condition as the condition (a)
resist ashing amount of about 80 nm, (c) O₂/CHF₃ process 2 corresponding to the first method + CHF₃ plasma process including:
1st process the same condition as the condition (b) for 135 sec.
2nd process
the same condition as the conditions (a) and (b).

The wiring layer AlSiCu/TiN was used, the sample stage was cooled to about 20° C., and the pattern of the wiring layer was the same as shown in FIG. 6.

The CHF₃ plasma process was performed in order to deposit CF based polymer on the wafer surface and isolate water contents in the air from Cl remaining on the wiring layer side walls, this process having no effects of reducing the amount of remaining Cl. In the conditions (a) and (b), the process time for the first process was set so as to obtain the same resist ashing amount both for the second method at low temperature and for the first method. In the condition (c), the process time for the first step was set so as to ash the resist completely.

As seen from FIG. 5B, it can be said that the conventional second method at low temperature described as the condition (a) provides the effects of reducing corrosions greater than the conventional first method. Rabbit ears, if any, can be removed easily by using amine based solution because the wafer was cooled when using the conventional second method under the condition. (a).

The present invention is not limited only to the above embodiment, but various modifications are possible such as the following modifications.

(A) As the H-and-O containing gas, not only but also C₂H₅OH, CH₃COCH₃, and the like may be used.

(B) As the F containing gas, not only CHF₃, but also CF₄, C₂F₆, NF₂, SF₆, and the like may be used which will generate by-products upon reaction with 0.

(C) As the ashing apparatus, not only a microwave plasma asher, but also a parallel plate electrode type plasma asher or the like may also be used.

As described so far, the plasma ashing process for ashing resist is performed by using an ashing gas of a mixed gas of the H-and-O containing gas and an O₂ gas added with a F containing gas, and without heating the substrate. Accordingly, an improved anticorrosion function can be obtained, and resist can be removed easily, allowing to manufacture high reliability integrated circuits with a high yield.

I claim:

1. A method of making a wiring layer comprising the steps of:
  (a) forming a wiring material layer on an insulating film on a substrate;
  (b) patterning said wiring material layer by a selective etching process using a resist film as a mask, and generating a wiring layer; and
  (c) ashing said resist film by using a plasma of a mixed gas of an alcohol, a F containing gas, and an O₂ gas, without heating said substrate.

2. A method of making a wiring layer according to claim 1, further comprising a step of performing an additional ashing process, after said ashing step (c), by using a plasma of a mixed gas of a F containing gas and an O₂ gas.

3. A method of making a wiring layer according to claim 1, wherein said H and O containing gas is at least one of the gases selected from the group consisting of CH₃OH, C₂H₅OH, CH₃COCH, and a mixture gases thereof.

4. A method of making wiring layer according to claim 1, wherein said F containing gas is a gas selected from the group consisting of CHF₃, CF₄, C₂F₆, NF₂, SF₆, and mixture gases thereof.

5. A method of making wiring layer according to claim 1, wherein said step (b) is performed by using a Cl based gas as an etchant.

6. A method of making a wiring layer having a wiring pattern defined by mask material on a substrate, comprising the steps of:

(a) ashing the mask material in a plasma ambient comprising a first mixture gas of $CH_3OH$, $CHF_3$ and $O_2$ and simultaneously cooling the substrate.

7. A method according to claim 6, further comprising the steps of:
(b) following step (a), ashing the mask material in a plasma ambient comprising a second mixture gas of $CHF_3$ and $O_2$ and simultaneously cooling the substrate.

8. A method of making a wiring layer having a wiring pattern defined by mask material on a substrate, comprising the steps of:
(a) ashing the mask material in a plasma ambient comprising a first gas comprising an alcohol, a second gas having fluorine as a constituent element and a third gas having oxygen as a sole constituent element, without heating the substrate.

9. A method according to claim 8, further comprising the steps of:
(b) following the step (a), ashing the mask material in a plasma ambient comprising a fourth gas having fluorine as a constituent element and a fifth gas having oxygen as a sole constituent element.

10. A method according to claim 9 further comprising the step of:
(c) cooling the substrate during step (a) and step (b).

11. A method according to claim 9 further comprising the steps of:
(d) forming a wiring material layer on an insulating film on the substrate; and
(e) providing the mask material with a mask pattern for selectively etching wiring material layer in conformity with the mask pattern, wherein steps (d) and (e) are performed before step (a) is performed.

12. A method according to claim 9 wherein the first gas comprises at least one gas selected from a group consisting of $CH_3OH$, $C_2H_5OH$, $CH_3COCH_3$ and mixtures thereof.

13. A method according to claim 9 wherein the second gas and fourth gas comprise at least one of gas selected from a group consisting of $CHF_3$, $CF_4$, $C_2F_6$, $NF_2$, $SF_6$ and mixtures thereof.

14. A method according to claim 9 wherein, during step (a), the first, second, and third gases are supplied at flow rates of 20 to 100 sccm, 5 to 20 sccm, and about 200 sccm, respectively.

15. A method according to claim 9 wherein, during step (b), the fourth and fifth gases are supplied at flow rates of about 5 sccm and 100 sccm, respectively.

16. A method according to claim 9, wherein the mask material is a resist.

17. A method according to claim 9, wherein the substrate comprises a semiconductor material.

18. A method according to claim 10 wherein, during step (c), the substrate is maintained at a temperature of 20° C. or below.

19. A method according to claim 11, wherein the wiring material layer comprises a metal selected from the group consisting of Al—Si and Al—Si—Cu.

20. A method of making a wiring layer having a wiring pattern defined by mask material on a substrate, comprising the steps of:
(a) removing the mask material in a plasma environment comprising a first gas comprising an alcohol, a second gas having fluorine as a constituent element and a third gas having oxygen as a sole constituent element.

21. A method according to claims 20, further comprising the steps of:
(b) after the step (a), removing the mask material in a plasma environment comprising a fourth gas having fluorine as a constituent element and a fifth gas having fluorine as a consituent element and a fifth gas having oxygen as a sole constituent element.

22. A method of making a wiring layer comprising the steps of:
(a) forming a barrier metal layer and a conductive material layer to collectively form a wiring layer on a substrate;
(b) patterning the wiring layer through a mask; and
(c) ashing the mask in a first plasma ambient comprising a first gas comprising an alcohol, a second gas having fluorine as a constituent element and a third gas having oxygen as a sole constituent element, without heating the substrate.

23. A method according to claim 22, further comprising the steps of:
(d) following the step (c), ashing the mask in a second plasma ambient comprising a fourth gas having fluorine as a constituent element and a fifth gas having oxygen as a sole constituent element.

24. A method according to claim 23, further comprising the steps of:
(e) cooling the substrate during the steps (c) and (d).

25. A method according to claim 22, wherein the first gas comprises at least one species of gas selected from a group consisting of $CH_3OH$, $C_2H_5OH$, $CH_3COCH_3$ and mixtures thereof.

26. A method according to claim 23, wherein the second gas and fourth gas each comprise at least one species of gas selected from a group consisting of $CHF_3$, $CF_4$, $C_2F_6$, $SF_6$ and mixtures thereof.

27. A method according to claim 22, wherein the mask is a resist layer.

28. A method according to claim 24, wherein during the step (e), the substrate is maintained at a temperature of 20° C or below.

29. A method according to claim 22, wherein the conductive material layer comprises a metal selected from a group consisting of Al—Si and Al—Si—Cu.

30. A method according to claim 22, wherein the barrier metal layer comprises TiN.

31. A method of making a wiring layer comprising the steps of:
(a) forming a barrier metal layer and a conductive material layer to collectively form a patterned wiring layer on a substrate;
(b) subjecting the substrate to a first plasma ambient comprising a first gas comprising an alcohol, a second gas having fluorine as a constituent element and a third gas having oxygen as a sole constituent element, without heating the substrate; and
(c) following the step (b), subjecting the substrate to a second plasma ambient comprising a fourth gas having fluorine as a constituent element and a fifth gas having oxygen as a sole constituent element, without heating the substrate.

32. A method according to claim 31, further comprising the steps of:
(d) cooling the substrate during the steps (b) and (c).

33. A method according to claim 31, wherein the first gas comprises at least one species of gas selected from a group consisting of $CH_3OH$, $C_2H_5OH$, $CH_3COCH_3$ and mixtures thereof.

34. A method according to claim 31, wherein the second gas and fourth gas each comprise at least one species of gas selected from a group consisting of $CHF_3$, $CF_4$, $C_2F_6$, $SF_6$ and mixtures thereof.

35. A method according to claim 31, wherein the conductive material layer comprises a metal selected from a group consisting of Al—Si and Al—Si—Cu.

36. A method according to claim 31, wherein the barrier metal layer comprises TiN.

* * * * *